United States Patent [19]

Ohtsuka et al.

[11] Patent Number: 5,296,801
[45] Date of Patent: Mar. 22, 1994

[54] BIAS VOLTAGE GENERATING CIRCUIT

[75] Inventors: Nobuaki Ohtsuka, Yokohama; Sumio Tanaka, Tokyo; Masao Kuriyama, Kawasaki, all of Japan

[73] Assignee: Kabushiki Kaisha Toshiba, Japan

[21] Appl. No.: 921,098

[22] Filed: Jul. 29, 1992

[30] Foreign Application Priority Data

Jul. 29, 1991 [JP] Japan .................................. 3-188807
Jul. 17, 1992 [JP] Japan .................................. 4-190402

[51] Int. Cl.$^5$ ............................................. G05F 3/16
[52] U.S. Cl. ............................. 323/313; 307/296.8; 365/189.09
[58] Field of Search ................ 323/312, 313, 314, 315; 307/296.2, 296.8, 296.6, 365/189.09

[56] References Cited

U.S. PATENT DOCUMENTS

| | | | |
|---|---|---|---|
| 4,135,125 | 1/1979 | Oura | 323/313 |
| 4,306,185 | 12/1981 | Leuschner | 323/312 |
| 4,812,735 | 3/1989 | Sawada et al. | 323/313 |
| 4,868,484 | 9/1989 | Seo et al. | 323/314 |
| 5,126,653 | 6/1992 | Ganesan et al. | 323/313 |
| 5,239,207 | 8/1983 | Miyamoto et al. | 307/296.1 |
| 5,245,273 | 9/1993 | Greaves et al. | 323/313 |

OTHER PUBLICATIONS

Ohtsuka, Nobuaki et al; ISSCC Digest of Technical Papers, dated Feb. 1991, vol. 34, pp. 262-263.
"FPM 16.1: A 60 ns 16 Mb Flash EEPROM (FIG. 6)" and FPM 16.2: A 62 ns 16 Mb CMOS EPROM (FIG. 5), ISSCC Digest of Technical Papers, 1991, p. 326.
S. Atsumi, et al., "Session 4: Non-Volatile and Fast Static Memories; WPM 4.2: A 16 ns 1 Mb CMOS EPROM," ISSCC Digest of Technical Papers, Feb. 1990, pp. 58-59, 265.
Y. Ohshima, et al., "Process and Device Technologies for 16 mBIT EPROMS with Large-Tilt-Angle Implanted P-Pocket Cell," IEDM Technical Digest, Dec. 1990, pp. 5.2.1-5.2.4(95-98).

Primary Examiner—Steven L. Stephan
Assistant Examiner—B. M. Davidson
Attorney, Agent, or Firm—Banner, Birch, McKie & Beckett

[57] ABSTRACT

A bias voltage generating circuit supplies a bias voltage to a memory's bit lines. One end of a first transistor is connected to a first power supply. The first transistor conducts in response to a control signal. A second transistor is connected to another end of the first transistor. Another end of the second transistor and a gate of the second transistor are connected to an output node. One end of a third transistor and a gate connected to the output node. One end of a fourth transistor and a gate are connected to a second end of the third transistor. A second end of the fourth transistor is connected to a second power supply. One end of a fifth transistor is connected to the first power supply. The fifth transistor also conducts in response to the control signal. A sixth transistor is connected to a second end of the fifth transistor. A second end of the sixth transistor is connected to the output node and the gate of the sixth transistor is connected to a potential source. A seventh transistor is connected to the output node. A second end of the seventh transistor is connected to a ground potential. The seventh transistor also conducts in response to the control signal. The output node outputs a bias voltage to the bit lines when the control signal is activated, and is grounded through the seventh transistor when the control signal is non-activated.

10 Claims, 7 Drawing Sheets

BIAS VOLTAGE GENERATING CIRCUIT

BACKGROUND OF THE INVENTION

1. Field of the Invention

The present invention relates generally to a bias voltage generating circuit applicable to a semiconductor memory such as an EPROM (Erasable Programmable Read Only Memory), and more particularly to a bias voltage generating circuit for supplying a bias voltage to bit lines.

2. Description of the Related Art

Figure 1:
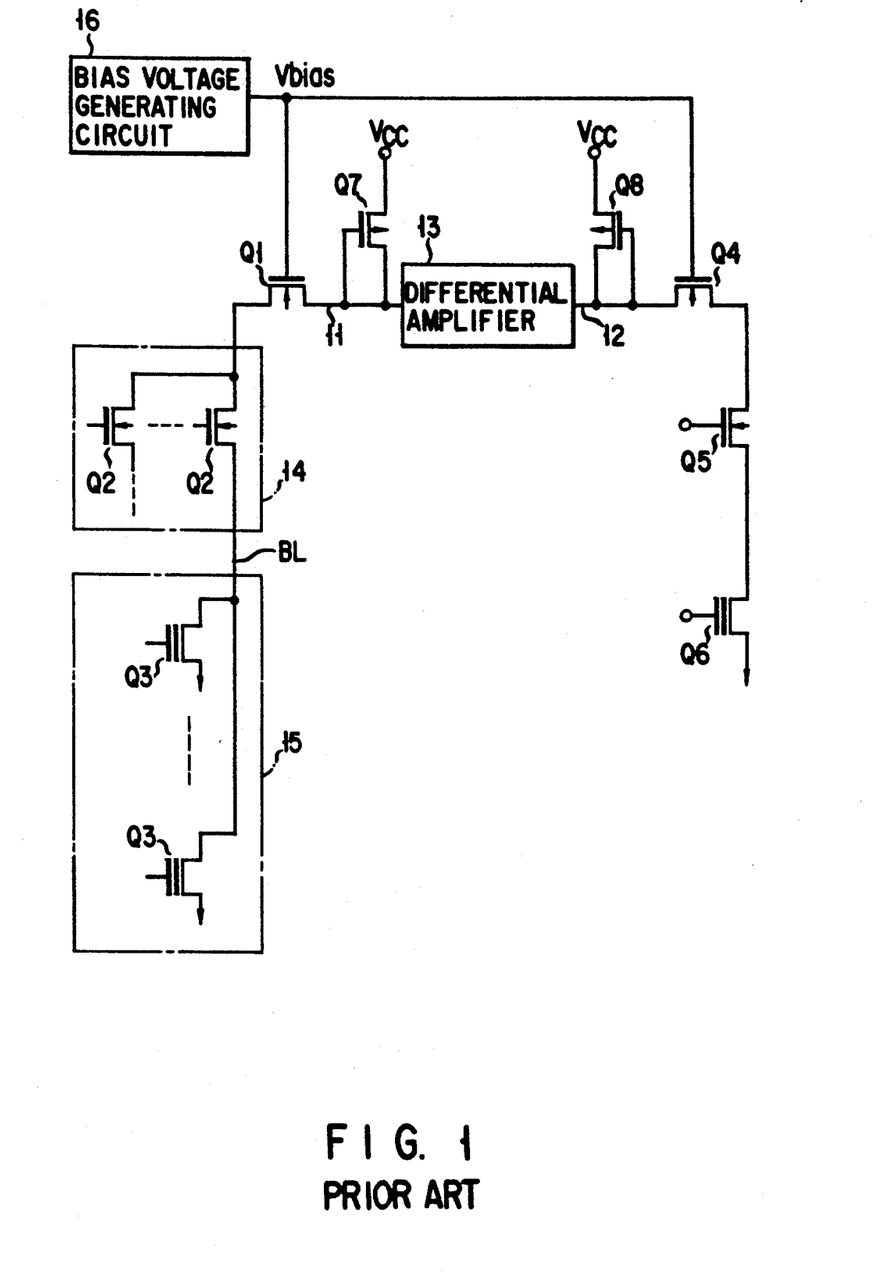
FIG. 1 shows a read-out circuit of a general EPROM.

FIG. 1 shows a read-out circuit of a general EPROM. One end of a sense line 11 and one end of a reference line 12 are connected to a differential amplifier 13 which constitutes a sense amplifier. The sense line 11 is connected to one end of a current path of each of a plurality of bit line selection transistors Q2, which constitute a Y selector 14, via a transistor Q2 functioning as a transfer gate. The other ends of the current paths of these transistors Q2 are connected to bit lines BL. The bit lines BL are connected to memory cells Q3 which store the data. Thus, a memory cell array 15 is constructed.

The other end of the reference line 12 is connected to a reference cell Q6 for reference, via a transistor Q4 functioning as a transfer gate and a transistor Q5 constituting a reference selector. The reference cell Q6 is always in the erase state.

The sense lines 11 and 12 are connected to a power supply Vcc via transistors Q7 and Q8 functioning as leads. The gates of the transistors Q1 and Q4 are connected to an output node of a bias voltage generating circuit 16 for generating a bias voltage Vbias.

In the above structure, the differential amplifier 13 compares the level of the sense line 11, which varies in accordance with the data stored in the selected memory cell Q3, and the level of the reference line 12 which is constant, thereby determining the data stored in the memory cell Q3.

The operation for reading out data "1" from the memory cell Q3 will now be described. The memory cell Q3 which stores data "1" is an erase-state cell having a low threshold voltage. Accordingly, this transistor is rendered conductive when it is selected. In this case, the charge of the sense line 11, which is charged by the transistor Q7, is discharged via the transistors Q1 and Q2, bit line BL and memory cell Q3. Accordingly, the bit line BL is set at a low voltage, e.g. about 1.0 V, at which the charge current of the transistor Q7 is balanced with the discharge current of the memory cell Q3.

The operation for reading out data "0" from the memory cell Q3 will now be described. The memory cell Q3 which stores data "0" has a high threshold voltage. Accordingly, even when this transistor is selected, it is not rendered conductive. Even if it is rendered conductive, a flowing current is much lower than in the case of the cell storing data "1." Accordingly, the sense line 11 and bit line BL are charged by the transistor Q7 and the potential thereof rises. However, suppose the case where the bias voltage output from the bias voltage generating circuit is Vbias and the threshold of the transistor Q1, which is determined in consideration of the back gate bias, is Vthn. In this case, when the potential of the bit line BL becomes Vbias-Vthn or above, the transistor Q1 is turned off and the bit line BL is no longer charged.

On the other hand, when the threshold of the transistor Q7 is Vthp, the potential of the sense line 11 is raised to Vcc-Vthp. In addition, the potential of the bit line BL at the time of read-out is clamped to Vbias-Vthn by the bias voltage. The potential of the reference line 12 is determined similarly with that of the sense line 11 by using the reference cell Q6. However, by making the size of the transistor Q8 larger than that of the transistor Q7 and increasing the charge potential, the potential of the reference line 12 is approximately set at the intermediate potential value of the swing of the sense line 11 due to the variation of data "1" and "0".

The bit line potential at the read-out time is clamped to Vbias-Vthn for the following reason: As is well known, when data is written in a memory cell, the control gate and drain are set at a high potential for writing, e.g. much higher than Vcc, and hot electrons are injected in the floating gate.

However, even in the case where the potential of the control gate and drain is low, if a stress is applied for a long time, a slight quantity of electrons are injected in the floating gate, that is so-called soft write. Thus, the bit line potential at the readout time must be set, with the variation of data due to soft write taken into account.

Specifically, it is necessary that the variation in threshold due to soft write does not affect normal operation, even if the data "1" in the memory cell is read out many times during the term of guarantee of, e.g. 10 years. Thus, the bit line potential is clamped at a low level by using the bias voltage. For example, the bit line voltage is normally set at about 1.0 V. L When data "0" is read out from the memory cell, the upper level of the bit line potential is clamped. Thus, the level difference between the upper limit and the bit line potential at the time of reading out data "1" from the memory cell can be clamped to, e.g. about 0.2 to 0.3 V. The bit line is provided with inherent drain diffusion capacitances of a number of memory cells. However, since the level difference between data "1" and data "0" is small, the time required for a variation in level is short and high speed access is achieved.

Since the potential of the sense line 11 separated from the bit line by the transistor Q1 functioning as a transfer gate swings in a wide range, as stated above, the margin of the differential amplifier 13 can be increased.

The bias voltage generating circuit 16 will now be described. The bit line potential is clamped to Vbias-Vthn, as described above. Thus, when the level of the bias voltage Vbias varies due to noise, etc., the level of the bit line varies accordingly. Once the level has varied, however, it takes a long time until the varied level restores to the original level since the bit line has a large inherent capacitance. Thus, the differential amplifier 13 requires a long time for determining the data. It is therefore important that the bias voltage Vbias is not affected by power supply noise.

Further, when the write amount is checked, etc., the level of the power supply voltage Vcc is raised to more than normal level. In this case, in order to prevent the soft write, it is desirable that the bias voltage Vbias be constant without being influenced by the power supply voltage Vcc.

Figure 2:
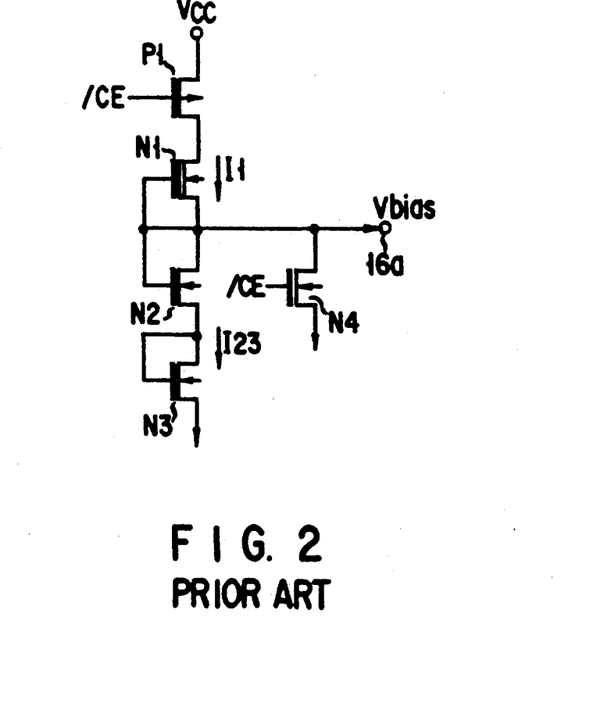
FIG. 2 shows a conventional bias voltage generating circuit.

FIG. 2 shows a conventional bias voltage generating circuit.

The gate and source of a depletion type N-channel transistor N1 are connected to an output node 16a. This transistor functions as a load, and its drain is connected to the drain of a P-channel transistor P1. In the standby mode, the transistor P1 cuts off a current flowing to the transistor N1. It has a sufficient size so that the current is limited by only N1. The source of the transistor P1 is connected to a first power supply Vcc, and the gate thereof is supplied with a chip enable signal /CE.

The gate and drain of an enhancement type N-channel transistor N2 are connected to the output node 16a. The source of the transistor N2 is connected to the gate and drain of an enhancement type N-channel transistor N3. The source of the transistor N3 is connected to a second power supply, e.g. a ground potential. The output node 16a is connected to a drain of the enhancement type N-channel transistor N4. The source of the transistor N4 is connected to the second power supply, and the gate thereof is supplied with a chip enable signal /CE. The transistor N4 resets the bias voltage Vbias output to a ground level.

In the above structure, when the chip enable signal /CE lowers to a low level, the transistor P1 is rendered conductive and a current flows to the transistors N1, N2 and N3.

Figure 3:
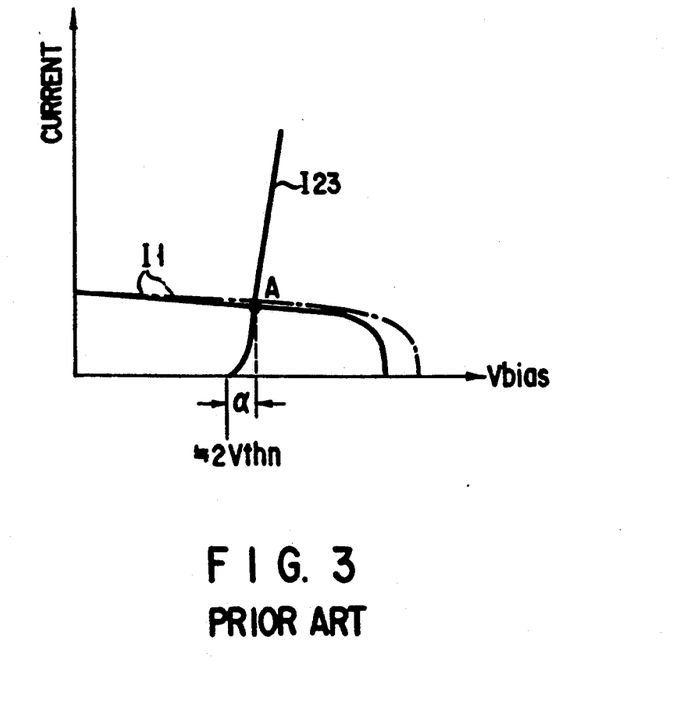
FIG. 3 is a graph showing a current characteristic of the circuit shown in FIG. 2.

FIG. 3 shows current characteristics (load characteristics) of the circuit shown in FIG. 2. In FIG. 3, I1 indicates a current flowing through the transistor N1, and I23 a current flowing through the transistors N2 and N3. As is shown in FIG. 3, the current I23 starts to flow when the bias voltage Vbias rises to about 2 Vthn or more. To be accurate, the threshold of the transistor N2 is slightly increased by a back bias effect. An intersection A between the current I23 and current I1 denotes the bias voltage Vbias which corresponds to the threshold 2 Vthn+α. In the vicinity of intersection A, the transistor N1 operates in a saturated region. Thus, even when the power supply voltage Vcc varies and I1 varies, as indicated by a dash-and-dot line, as shown in FIG. 3, the position of intersection A hardly changes. Accordingly, the bias voltage Vbias is substantially constant, independently of the potential of the power supply Vcc.

The bias voltage generating circuit 16 is constituted by an analog circuit. By contrast, it is common that recently developed devices such as EPROMs are constituted by CMOS circuits and power consumption is reduced. Accordingly, it is desirable that a DC flowing through the bias voltage generating circuit be low. For this purpose, it is necessary that the size of the depletion type N-channel transistor N1 be reduced and the current be decreased. However, at the standby time, the transistor P1 cuts off DC and the transistor N4 sets the bias voltage Vbias to a ground potential. Thus, the rising time of the bias voltage when the chip is selected and activated is delayed by decreasing the size of the transistor N1. Therefore, the size of the transistor N1 cannot be reduced unnecessarily.

With the miniaturization of the feature size of the memory cell such as gate length, insulating film thickness, etc., the memory cell becomes more sensitive to the write operation. Thus, in order to prevent soft write, it is necessary to further reduce the bit line potential in the read mode. Specifically, in the case of the circuit shown in FIG. 2, it is necessary to reduce the potential c shown in FIG. 3. In this case, however, a problem arises if the size of the transistor N1 is reduced excessively.

Figure 4:
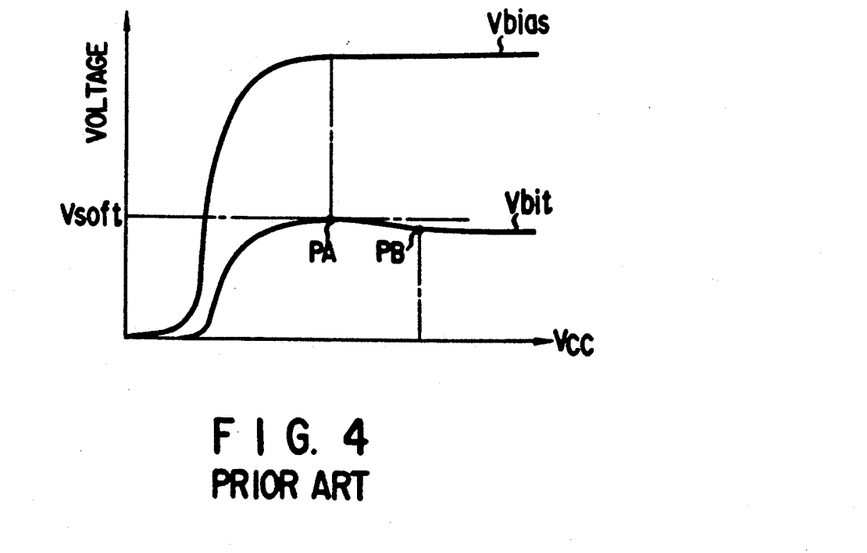
FIG. 4 is a graph showing the relationship between the bias voltage Vbias and the bit line potential Vbia in the circuit shown in FIG. 2.

On the other hand, FIG. 4 shows the relationship between the bias voltage Vbias and bit line potential Vbit in the circuit shown in FIG. 2. As has been described above, the bias voltage Vbias is constant in the range of power supply voltage Vcc in which the circuit operates normally. However, in the range in which the bias voltage Bias is constant, the bit line potential Vbit lowers as the power supply voltage Vcc rises. In other words, since the power supply voltage Vcc is applied to the gate of the memory cell, the current flowing through the memory cell increases when the power supply voltage rises.

In FIG. 4, the bit line potential takes a maximum value at point PA, above where the bias voltage Vbias does not depend on the power supply voltage Vcc. Thus, at point PA the bias voltage Vbias is lower than a normal operation voltage Vcc=5 V. Accordingly, if the upper limit of the bit line potential, determined in consideration of soft write, is Vsoft, the bit line potential Vbit at point PA is limited to Vsoft. Then, in actual operation point PB, the bit line potential Vbit is lower than the potential Vsoft. Accordingly, the current flowing through the memory cell at operation point PB decreases by a degree corresponding to the lowering of the drain voltage, and the access time becomes worse than in the case of the potential Vsoft.

SUMMARY OF THE INVENTION

The object of the present invention is to provide a bias voltage generating circuit wherein a bias voltage can be quickly recovered when the the chip is activated, consumed current in the operation state can be decreased, and, when data is read out from a memory cell, a bit line potential does not depend on a power supply potential and access time can be reduced.

This object can be achieved by a bias voltage generating circuit comprising:
- a depletion-type first transistor having a current path, one end of the current path being connected to a first power supply, the other end of the current path and a gate of the first transistor being connected to an output node;
- an enhancement-type second transistor having a current path, one end of the current path and a gate of the second transistor being connected to the output node;
- an enhancement-type third transistor having a current path, one end of the current path and a gate of the third transistor being connected to the other end of the current path of the second transistor, the other end of the current path of the third transistor being connected to a second power supply;
- a depletion-type fourth transistor having a current path, one end of the current path being connected to the first power supply, the other end of the current path being connected to the output node, the gate of the fourth transistor being connected to a potential source

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 5:
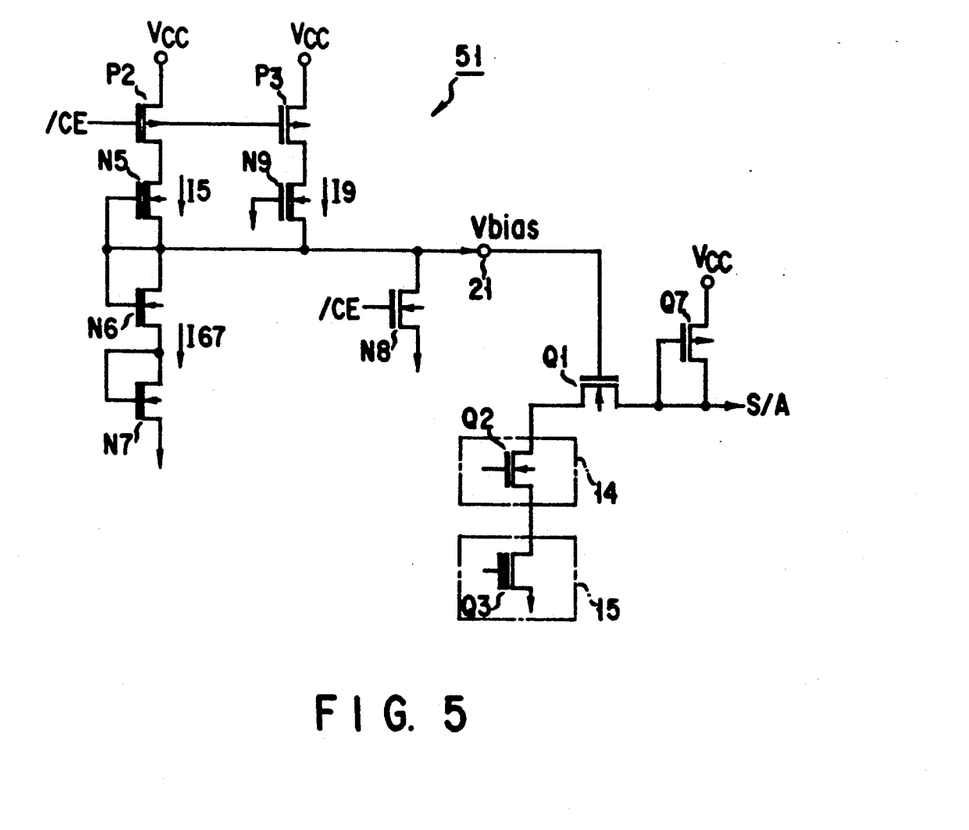
FIG. 5 shows a bias voltage generating circuit according to a first embodiment of the present invention.

FIG. 5 shows a bias voltage generating circuit 51 according to a first embodiment of the invention. The same structural elements as shown in FIG. 1 are denoted by like reference numerals.

In FIG. 5, the gate and source of a depletion type N-channel transistor N5 are connected to an output node 21. The transistor N5 functions as a load, and the drain thereof is connected to the drain of a P-channel transistor P2. The transistor P2 cuts off a current flowing through the transistor N5 in standby mode and has a sufficient channel width. The source of the transistor P2 is connected to a first power supply Vcc, and the gate thereof is supplied with a chip enable signal/CE.

The gate and drain of an enhancement type N-channel transistor N6 are connected to the output node 21. The source of the transistor N6 is connected to the gate and drain of an enhancement type N-channel transistor N7. The source of the transistor N7 is connected to a second power supply, e.g. a ground potential.

The drain of an enhancement type N-channel transistor N8 is connected to the output node 21. The source of the transistor N8 is connected to the second power supply (e.g. ground potential), and the gate thereof is supplied with a chip enable signal/CE. The transistor N8 resets the bias voltage Vbias output to a ground level.

The source of a depletion type N-channel transistor N9 is connected to the output node 21. The transistor N9 functions as a load, and the gate thereof is connected to the second power supply (e.g. ground potential). The drain of the transistor N9 is connected to the drain of a P-channel transistor P3. The transistor P3 cuts off a current flowing to the transistor N9 in the standby mode. The source of the transistor P3 is connected to the first power supply Vcc, and the gate thereof is supplied with the chip enable signal/CE.

In the above structure, when the transistors P2 and P3 are rendered conductive in response to the chip enable signal/CE, a current flows through the transistors N5 and N9, and a bias voltage starts to rise. Since the transistor N9 is of the depletion type, a current 19 continues to flow while the bias voltage output from the output node 21 is low. Unlike the transistor N5, the gate of the transistor N9 is grounded. Thus, as the bias voltage Vbias increases, the flowing current decreases. Once the bias voltage Vbias becomes substantially constant, no current flows through the transistor N9, and the bias voltage Vbias is output by only current flowing through the transistor N5. The bias voltage Vbias is equal to the threshold voltage 2Vthn of the transistors N6 and N7.

Figure 6:
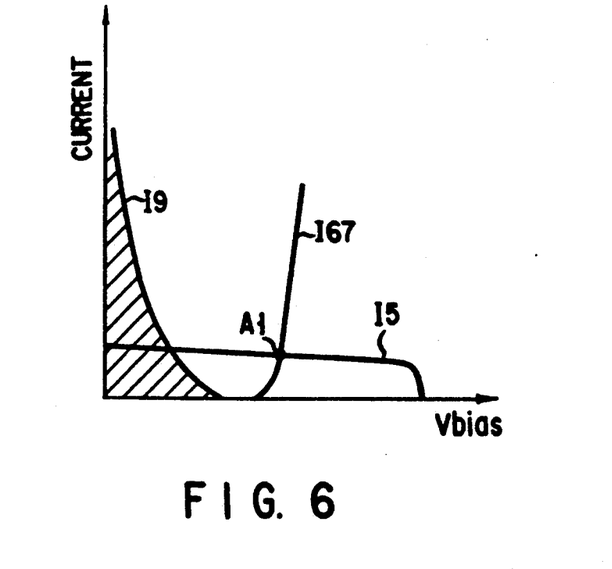
FIG. 6 is a graph showing a current characteristic of the circuit shown in FIG. 5.

FIG. 6 shows current characteristics of the above circuit.

When the standby mode ends and the bias voltage Vbias starts to recover, the current 19 indicated by hatched lines in FIG. 6 contributes to the charge of the bias voltage Vbias. Accordingly, even if the charge current supplied by the transistor N5 is small, the rising of the bias voltage Vbias is not worse than in the case shown in FIG. 3. At point A1 where the bias voltage Vbias becomes constant, the current 19 hardly flows and only DC 15 flows through the transistor N. Specifically, in the normal operation mode, the power consumption of the bias voltage generating circuit 51 is determined only by the transistor N. The current 15 is reduced, as compared to the case shown in FIG. 3. Thus, in the normal operation mode, DC power consumption can be decreased. In addition, the bias voltage Vbias does not depend on the power supply Vcc, like the circuit shown in FIG. 2.

According to this embodiment, DC power consumption in the operation mode can be reduced, without delaying the recovery time of the bias voltage after the standby mode.

Figure 7:
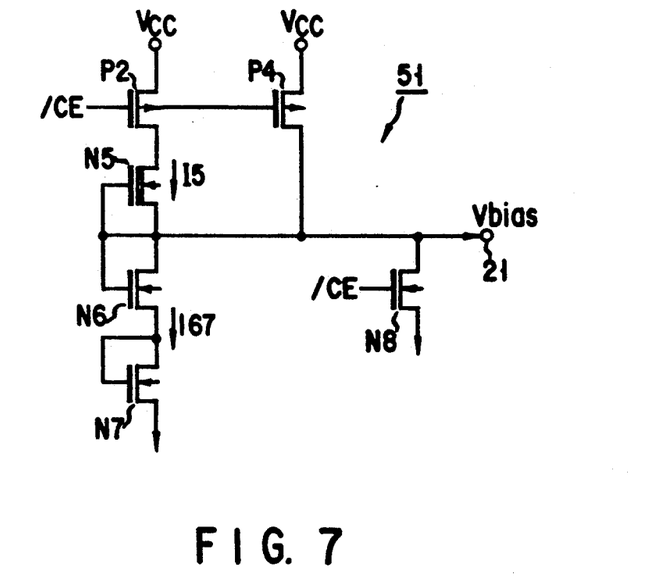
FIG. 7 is a circuit diagram showing a second embodiment of the present invention.

FIG. 7 shows a second embodiment of the invention. The same structural elements as shown in FIG. 5 are denoted by like reference numerals, and only different portions will be described.

In the second embodiment, a P-channel transistor P4 is substituted for the transistors N9 and P3 employed in the first embodiment. Specifically, the drain of the P-channel transistor P4 is connected to the output node 21. The source of the transistor P4 is connected to the power supply Vcc, and the gate thereof is supplied with the chip enable signal/CE. The size of the transistor P4 is smaller than that of the transistor P2.

In the above structure, the transistors P2 and N5 to N7 operate in the similar manner with the above embodiment. The current flowing through the transistor P4 depends on the power supply Vcc. Specifically, when the chip enable signal/CE is active, the gate potential of the transistor P4 is at a ground level and the source potential is the power supply potential Vcc. Accordingly, the gate-source voltage VGS of the transistor P4 varies in accordance with the power supply voltage Vcc. Thus, when the power supply voltage Vcc rises, the bias voltage Vbias output from the output node 21 via the transistor P4 rises. However, the transistor N5 does not depend on the power supply voltage Vcc and exhibits a constant current characteristic. Therefore, by making the size of the transistor P4 smaller than that of the transistor P2, the bias voltage Vbias can be made to depend on the power supply voltage Vcc.

By making the bias voltage Vbias suitably depend on the power supply voltage Vcc, the decrease in bit line potential Vbit due to the increase in power supply voltage Vcc can be canceled by the increase in bias voltage Vbias.

Figure 8:
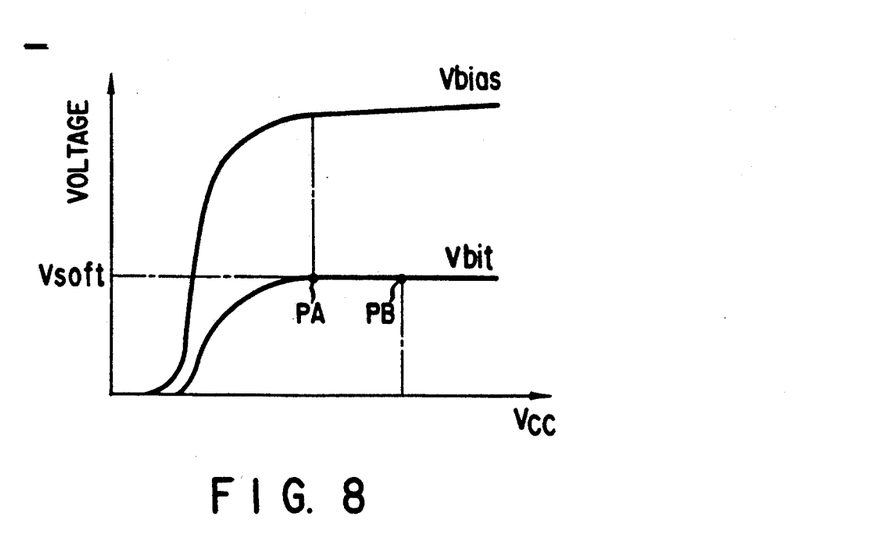
FIG. 8 is a graph showing the relationship between the bias voltage Vbias and the bit line potential Vbit in the circuit shown in FIG. 7.

Specifically, as shown in FIG. 8, the bias voltage Vbias rises in accordance with the increase in power supply voltage Vcc, but the bit line potential Vbit is constant in a range approximately from point PA to operation point PB. Thus, the dependency of the bit line potential Vbit on the power supply voltage Vcc can be eliminated. Accordingly, the bit line potential Vbit near the operation point PB can be raised to the maximum bit line potential Vsoft, in consideration of the soft write. Thus, the soft write can be prevented, and the decrease in cell current due to the decrease in drain potential, as shown in FIG. 4, can be prevented. Therefore, the delay in access time can be prevented.

Figure 9:
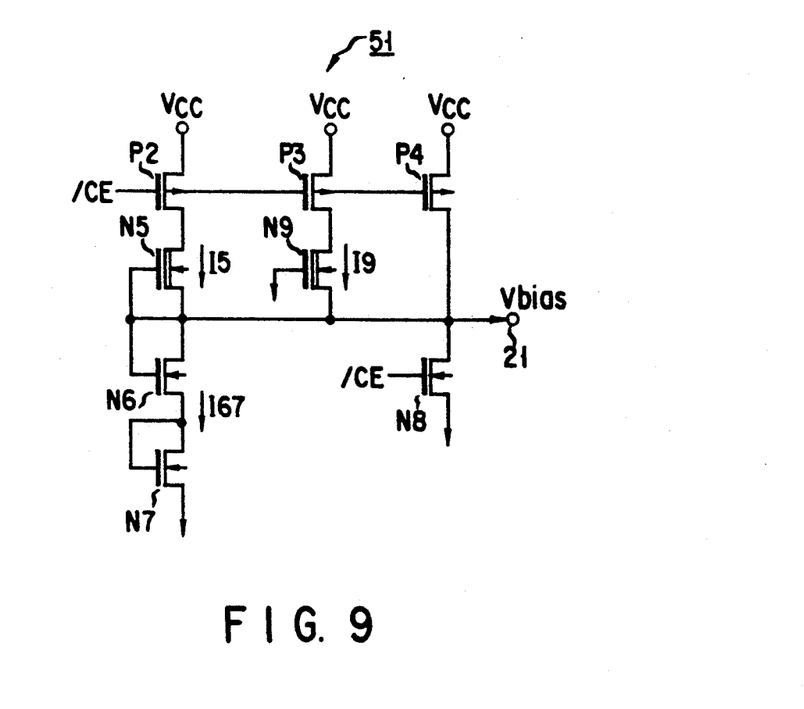
FIG. 9 is a circuit diagram showing a third embodiment of the present invention.

FIG. 9 shows a third embodiment of the invention. The same structural elements as shown in FIGS. 5 and 7 are denoted by like reference numerals.

The third embodiment is a combination of the first and second embodiments. According to this embodiment, the following advantages obtained in the first and second embodiments can be obtained: prevention of delay in rising of bias voltage after the standby mode, the decrease in DC power consumption in normal operation, prevention of delay in access time, and prevention of dependency of bit line voltage on power supply voltage Vcc.

Figure 10:
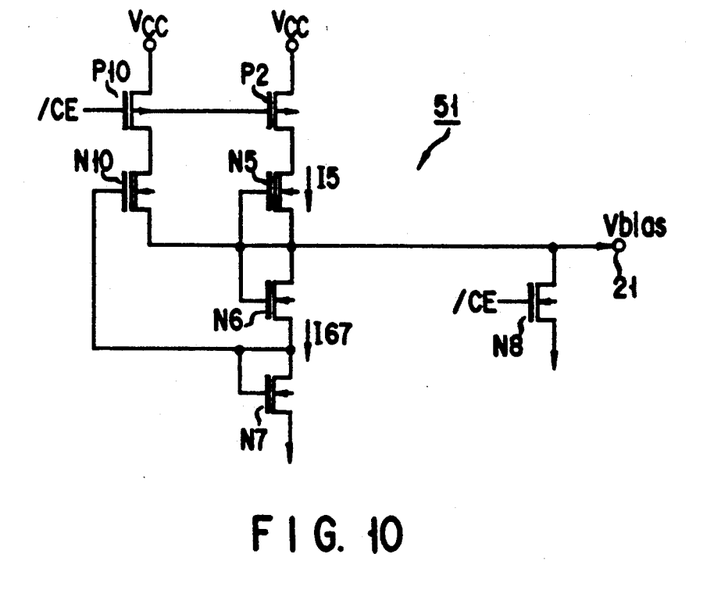
FIG. 10 is a circuit diagram showing a fourth embodiment of the invention.

FIG. 10 shows a fourth embodiment of the invention. The same structural elements as in FIGS. 5, 7 and 9 are denoted by like reference numerals.

The output node 21 is connected to the source of the depletion type N-channel transistor N10. The gate of the transistor N10 is connected to a potential source, e.g. the gate and drain of the transistor N7, and the drain of the transistor N10 is connected to the drain of a P-channel transistor P10. The source of the transistor P10 is connected to the first power supply Vcc, and the gate of the transistor N10 is supplied with the chip enable signal/CE.

When the chip enable signal/CE lowers from the high level to the low level, the transistor N10 accelerates the rising of the bias voltage. The transistor P10 is turned off in the standby mode, i.e. when the chip enable signal/CE is set at the high level, thereby cutting off current to the transistor N10.

Figure 11:
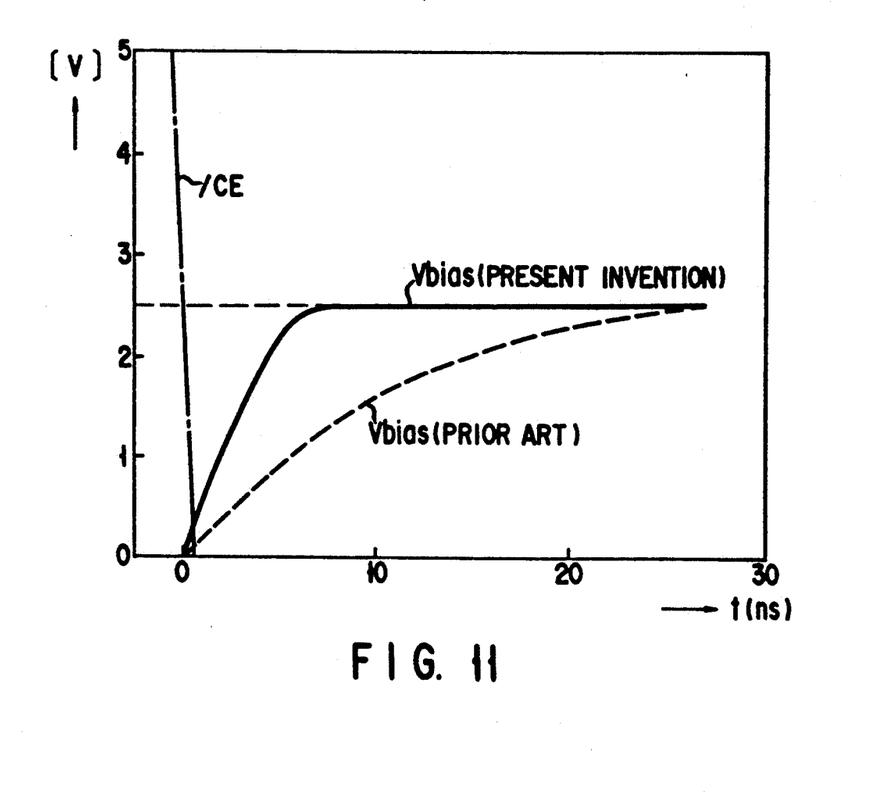
FIG. 11 is a graph for explaining the operation of the circuit of FIG. 10.

The operation of the above embodiment with this structure will now be described with reference to FIG. 11.

When the chip enable signal/CE is pulled down from the high level to the low level and the bias voltage Vbias begins to rise, i.e. when the bias voltage Vbias is substantially the ground potential, the gate of the transistor N10 is supplied with a drain potential of the transistor N7. Thus, the gate potential Vg of the transistor N10 is OV. In a later period of rising of the bias voltage Vbias, the gate potential Vg of the transistor N10 is equal to the threshold voltage Vthn of the transistor N7.

As has been described above, by increasing the gate potential of the transistor N10 in synchronism with the rising of the bias voltage generated by the bias voltage generating circuit 51, the lowering of the mutual conductance gm of the transistor N10 at the time of rising in bias voltage Vbias can be prevented. Therefore, the bias potential Vbias can be increased stably at high speed.

On the other hand, when the bias potential Vbias becomes constant, the gate potential Vg of the transistor N10 is given by $$Vg \; (=Vthn) \leq Vbias + Vthd$$

wherein Vthd is the threshold voltage of the transistor N10. Thus, the transistor N10 is turned off.

Employing the above condition for operation, the bias voltage Vbias equal to the threshold voltage 2 Vthn of the transistor N6, N7 can be output. In addition, the current consumed in the bias voltage generating circuit 51 is determined only by the current flowing to the transistor N5, and the bias voltage Vbias does not depend on the power supply voltage.

Figure 12:
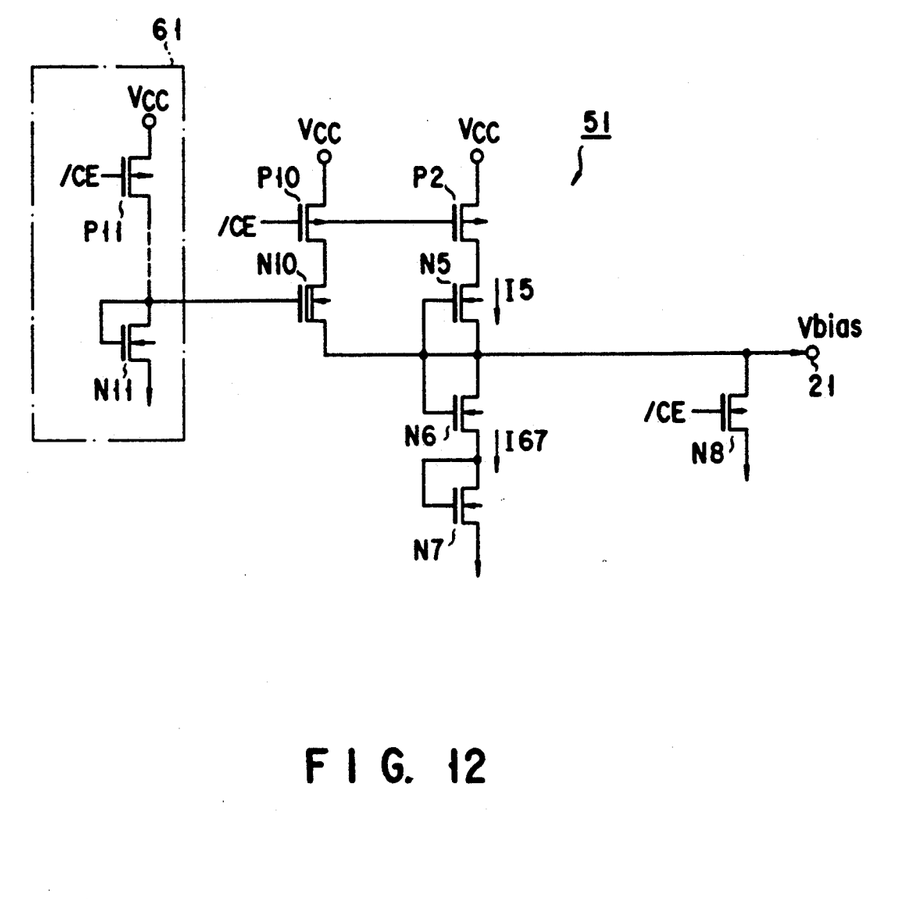
FIG. 12 is a circuit diagram showing a fifth embodiment of the present invention.

FIG. 12 shows a fifth embodiment of the invention, and the same structural elements as in FIG. 10 are denoted by like reference numerals.

In the fourth embodiment, the gate of the transistor N10 is connected to the drain of the transistor N7 serving as a constant power source. In the fifth embodiment, the gate of the transistor N10 is connected to a constant voltage generating circuit 61. Specifically, in the constant voltage generating circuit 61, the source of a P-channel transistor P11 is connected to the first power source Vcc, and the gate thereof is supplied with the chip enable signal/CE. The drain of the transistor P11 is connected to the drain of an N-channel transistor N11 and the gate of the transistor N10. The source of the transistor N11 is connected to the second power source, e.g. a ground potential.

In the constant voltage generating circuit 61, when the chip enable signal/CE is at low level, the transistor P11 is rendered conductive, and the N-channel transistor N11 generates a constant voltage. The constant voltage is supplied to the gate of the transistor N10.

Accordingly, the same advantages as in the first embodiment can be obtained. Further, the gate voltage of the transistor N10 is higher than that of the ground potential and therefore the conductive state of the transistor N10 can be kept up to a higher level of the bias voltage Vbias. Thus, acceleration of the bias voltage Vbias can be made faster. In addition, since a desired voltage can be generated by varying the size of the transistor N11, the turning-on speed of the transistor N10 can be set freely.

In the above embodiments, the present invention has been applied to EPROMs, but it is applicable to a flash EPROM capable of electrically erasing stored data at a time, a DRAM, etc.

As a matter of course, other various modifications may be made without departing from the spirit of the present invention.

What is claimed is:

1. A bias voltage generating circuit for supplying a bias voltage to bit lines of a memory, comprising:
    an enhancement-type first transistor of a first conductivity type having a current path with a first end connected to a first power supply, said first transistor being rendered conductive in accordance with a control signal being supplied to a gate thereof;
    a depletion-type second transistor of a second conductivity type having a current path with a first end connected to a second end of the current path of the first transistor, a second end of the current path of the second transistor and a gate of the second transistor being connected to an outer node;

an enhancement-type third transistor of the second conductivity type having a current path, a first end of the current path of the third transistor and a gate of the third transistor being connected to the output node;

an enhancement-type fourth transistor of the second conductivity type having a current path, a first end of the current path of the fourth transistor an a gate of the fourth transistor being connected to a second end of the current path of the third transistor, a second end of the current path of the fourth transistor being connected to a second power supply;

an enhancement-type fifth transistor of the first conductivity type having a current path, a first end of the current path of the fifth transistor being connected to the first power supply, the fifth transistor being rendered conductive in accordance with said control signal also being supplied to a gate thereof;

a depletion-type sixth transistor having a current path, a first end of the current path of the sixth transistor being connected to a second end of the current path of the fifth transistor, a second end of the current path of the sixth transistor being connected to the output node, the gate of the sixth transistor being connected to a potential source; and an enhancement-type seventh transistor of the second conductivity type having a current path, a first end of the current path of the seventh transistor being connected to the output node, a second end of the current path of the seventh transistor being connected to a ground potential, said seventh transistor being rendered non-conductive in accordance with said control signal also being supplied to a gate thereof, wherein said output node outputs a bias voltage to the bit lines when the control signal is activated, and said output node is grounded through the seventh transistor when the control signal is non-activated.

2. The circuit according to claim 1, wherein said potential source is the second power supply source.

3. The circuit according to claim 2, wherein the potential of the second power supply is a ground potential.

4. The circuit according to claim 1, wherein the gate of the sixth transistor is connected to said one end of the current path of the fourth transistor which serves as said potential source.

5. The circuit according to claim 1, wherein said potential source is constituted by an enhancement-type eighth transistor having a current path, one end of the current path of the eighth transistor and a gate of the eighth transistor being connected to the first power supply and the gate of the sixth transistor, the other end of the current path of the eighth transistor being grounded.

6. A bias voltage generating circuit for supplying a bias voltage to bit lines of a memory, comprising:
a first transistor of a first conductivity type having a current path with a first end connected to a first power supply, said first transistor being rendered conductive in accordance with a control signal being supplied to a gate thereof;
a depletion-type second transistor of a second conductivity type having a current path with a first end connected to a second end of the current path of the first transistor, a second end of the current path of the second transistor and a gate of the second transistor being connected to an output node for connection to bit lines of a memory;
a third transistor of a second conductivity type having a current path, a first end of the current path of the third transistor and a gate of the third transistor being connected to the output node;
a fourth transistor of the second conductivity type having a current path, a first end of the current path of the fourth transistor and a gate of the fourth transistor being connected to a second end of the current path of the third transistor, a second end of the current path of the fourth transistor being connected to a second power supply; and
a fifth transistor of the first conductivity type having a current path, a first end of the current path of the fifth transistor being connected to the first power supply, a second end of the current path of the fifth transistor being connected to the output node, the fifth transistor being rendered conductive in accordance with said control signal,
wherein the size of the fifth transistor is smaller than that of the first transistor.

7. The circuit according to claim 6, wherein the output node is connected to a bit line of a non-volatile memory.

8. A bias voltage generating circuit for supplying a bias voltage to bit lines of a memory, comprising:
a first transistor of a first conductivity type having a current path with a first end connected to a first power supply, said first transistor being rendered conductive in accordance with a control signal being supplied to a gate thereof;
a depletion-type second transistor of a second conductivity type having a current path with a first end connected to a second end of the current path of the first transistor, a second end of the current path of the second transistor and a gate of the second transistor being connected to an output node for connection to bit lines of a memory;
a third transistor of the second conductivity type having a current path, a first end of the current path of the third transistor and a gate of the third transistor being connected to the output node;
a fourth transistor of the second conductivity type having a current path, a first end of the current path of the fourth transistor and a gate of the fourth transistor being connected to a second end of the current path of the third transistor, a second end of the current path of the fourth transistor being connected to a second power supply;
a fifth transistor of the first conductivity type having a current path, a first end of the current path of the fifth transistor being connected to the first power supply, a second end of the current path of the fifth transistor being connected to the output node, the size of the fifth transistor being smaller than that of the first transistor, the fifth transistor being rendered conductive in accordance with said control signal also being supplied to a gate thereof;
a sixth transistor having a current path with a first end connected to the first power supply, said sixth transistor being rendered conductive in accordance with said control signal also being supplied to a gate thereof; and
a depletion-type seventh transistor having a current path with a first end connected to a second end of the current path of the sixth transistor, a second end of the current path of the seventh transistor being connected to the output node, and the gate of the seventh transistor being connected to a potential source.

9. A bias voltage generating circuit comprising:
a first transistor of a first conductivity type having a current path with one end connected to a first power supply, said first transistor being rendered conductive in accordance with a control signal being supplied to a gate thereof;
a depletion-type second transistor of a second conductivity type having a current path with one end connected to the other end of the current path of the first transistor, the other end of the current path of the second transistor and a gate of the second transistor being connected to an output node;
a third transistor of the second conductivity type having a current path, one end of the current path of the third transistor and a gate of the third transistor being connected to the output node;
a fourth transistor of the second conductivity type having a current path, one end of the current path of the fourth transistor and a gate of the fourth transistor being connected to the other end of the current path of the third transistor, the other end of the current path of the fourth transistor being connected to a second power supply;
a fifth transistor of the first conductivity type having a current path with one end connected to the first power supply, the fifth transistor being rendered conductive in accordance with said control signal being supplied with a gate; and
a depletion-type sixth transistor of the second conductivity type having a current path with one end connected to the other end of the current path of the fifth transistor, the other end of the current path of the sixth transistor being connected to the output node, and the gate of the sixth transistor being connected to said one end of the current path of the fourth transistor.

10. A bias voltage generating circuit comprising:
a first transistor of a first conductivity type having a current path with one end connected to a first power supply, said first transistor being rendered conductive in accordance with a control signal being supplied to a gate thereof;
a depletion-type second transistor of a second conductivity type having a current path with one end connected to the other end of the current path of the first transistor, the other end of the current path of the second transistor and a gate of the second transistor being connected to an output node;
a third transistor of the second conductivity type having a current path, one end of the current path of the third transistor and a gate of the third transistor being connected to the output node;
a fourth transistor of the second conductivity type having a current path, one end of the current path of the fourth transistor and a gate of the fourth transistor being connected to the other end of the current path of the third transistor, the other end of the current path of the fourth transistor being connected to a second power supply;
a fifth transistor of the first conductivity type having a current path with one end connected to the first power supply, the fifth transistor being rendered conductive in accordance with said control signal being supplied to a gate thereof;
a depletion-type sixth transistor of the second conductivity type having a current path with one end connected to the other end of the current path of the fifth transistor, the other end of the current path of the sixth transistor being connected to the output node;
a seventh transistor of the first conductivity type having a current path with one end connected to the first power supply, the seventh transistor being rendered conductive in accordance with said control signal being supplied to a gate thereof; and
an eighth transistor of the second conductivity type having a current path, one end of the current path of the eighth transistor and a gate of the eighth transistor being connected to the other end of the current path of the seventh transistor and the gate of the sixth transistor, the other end of the current path of the eighth transistor being grounded, said eighth transistor supplying a constant voltage to the gate of the sixth transistor.

* * * * *